US009214937B2

(12) United States Patent
Thoss et al.

(10) Patent No.: US 9,214,937 B2
(45) Date of Patent: Dec. 15, 2015

(54) INDUCTIVE PROXIMITY SENSOR

(75) Inventors: Sascha Thoss, Freiburg (DE); André Lissner, Freiburg (DE)

(73) Assignee: Sick AG, Waldkirch (DE)

(*) Notice: Subject to any disclaimer, the term of this patent is extended or adjusted under 35 U.S.C. 154(b) by 526 days.

(21) Appl. No.: 13/557,849

(22) Filed: Jul. 25, 2012

(65) Prior Publication Data

US 2013/0033273 A1    Feb. 7, 2013

(30) Foreign Application Priority Data

Aug. 5, 2011  (EP) .................................... 11176644

(51) Int. Cl.
*G01V 3/08* (2006.01)
*G01B 7/14* (2006.01)
*H03K 17/95* (2006.01)

(52) U.S. Cl.
CPC .......... *H03K 17/9512* (2013.01); *H03K 17/954* (2013.01); *H03K 17/9525* (2013.01); *H03K 2017/9527* (2013.01)

(58) Field of Classification Search
CPC .................... G06K 19/0723; G06K 19/07749; H04B 5/0031; H04B 5/0037; A61B 5/055; A61B 5/0073
USPC ............ 324/207.11–207.26, 322, 76.75, 318, 324/202; 235/449, 492; 455/39, 41.1; 331/65
See application file for complete search history.

(56) References Cited

U.S. PATENT DOCUMENTS

| | | | | |
|---|---|---|---|---|
| 5,994,897 A * | 11/1999 | King | ...................... | G01V 3/104 324/228 |
| 7,847,539 B2 * | 12/2010 | Machul | .............. | H03K 17/9512 324/202 |
| 2007/0216399 A1 * | 9/2007 | Reusing | ............. | G01D 5/24457 324/207.12 |
| 2009/0224751 A1 * | 9/2009 | Budde | .................... | G01D 5/208 324/207.17 |
| 2010/0207611 A1 * | 8/2010 | Thoss | .................. | G01D 5/2073 324/207.15 |
| 2011/0057668 A1 * | 3/2011 | Chen | ..................... | G01B 7/023 324/655 |

FOREIGN PATENT DOCUMENTS

| | | |
|---|---|---|
| DE | 19911958 A1 | 10/2000 |
| DE | 10244104 A1 | 4/2004 |
| DE | 102004029192 A1 | 12/2005 |
| EP | 0371261 A2 | 6/1990 |
| EP | 0479078 A2 | 4/1992 |
| EP | 1455454 A2 | 9/2004 |

* cited by examiner

*Primary Examiner* — Patrick Assouad
*Assistant Examiner* — Taqi Nasir
(74) *Attorney, Agent, or Firm* — Nath, Goldberg & Meyer; Jerald L. Meyer; Rury L. Grisham

(57) ABSTRACT

An inductive proximity sensor and a method comprising a transmitter coil, a receiver coil, an excitation device which is connected to the transmitter coil and an evaluation device, wherein the evaluation device is designed to generate an output signal which depends on a voltage ratio between a transmission voltage of the transmitter coil and/or of the excitation device and a reception voltage of the receiver coil, wherein the excitation device is designed to generate a sinusoidal radio frequency transmission voltage. An inductive proximity sensor and a method comprising a transmitter coil, a receiver coil, an excitation device which is connected to the transmitter coil and an evaluation device, wherein the evaluation device is designed to generate an output signal which is dependent on a reception voltage of the receiver coil, wherein the excitation device is designed to generate a sinusoidal radio frequency transmission voltage with a constant amplitude.

14 Claims, 3 Drawing Sheets

INDUCTIVE PROXIMITY SENSOR

Figure 1:
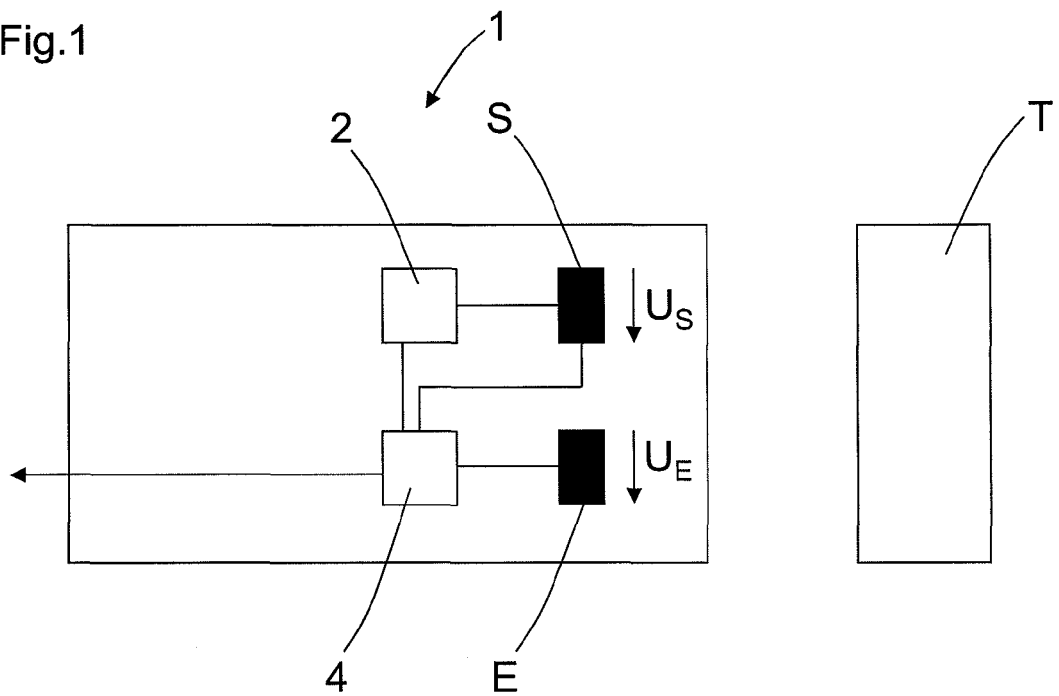

The present invention relates to a proximity sensor, in particular to an inductive proximity sensor.

Such inductive proximity sensors serve for the recognition of a body, in particular a metallic body or a body with good electrical conductivity, called a target, which is introduced into a region of influence of the proximity sensor. Conventional proximity sensors comprise an oscillator which includes a coil which generates a magnetic field with an oscillating oscillator. In a target to be detected which is introduced into the magnetic field, eddy currents are induced which generate a counter-field directed against the magnetic field and thus withdraw energy from the oscillator. The oscillator in the known proximity sensors is dimensioned so that this energy withdrawal results in the collapse of the oscillation of the oscillator or in a specific amplitude at a specific target distance. This procedure is then detected for the purpose of the detection of the target.

Such proximity sensors as a rule have a switching distance which is too small for specific applications. The switching distance designates the maximum distance of a target from the proximity sensor at which a detection of the target by the sensor is still reliably possible.

Since ferromagnetic and non-ferromagnetic materials differ greatly in the influencing of known proximity sensors, targets of different materials result in different switching states. This is unwanted and disadvantageous in many applications.

It is the underlying object of the invention to provide an inductive proximity sensor which has an elevated sensitivity, which allows increased switching intervals with respect to the prior art, whose switching intervals are independent of the target material and which can moreover be manufactured at reduced costs.

The object is satisfied by an inductive proximity sensor, by a transmitter coil, by a receiver coil, by an excitation device which is connected to the transmitter coil and by an evaluation device which is connected to the transmitter coil and/or to the excitation device as well as to the receiver coil, wherein the evaluation device is designed to generate an output signal which depends on a voltage ratio between a transmission voltage of the transmitter coil and/or of the excitation device and a reception voltage of the receiver coil, wherein the excitation device is designed to generate a sinusoidal radio frequency transmission voltage.

The object is further satisfied by an inductive proximity sensor, by a transmitter coil, by a receiver coil, by an excitation device which is connected to the transmitter coil and by an evaluation device which connected at least to the receiver coil, wherein the evaluation device is designed to generate an output signal which is dependent on a reception voltage of the receiver coil, wherein the excitation device is designed to generate a sinusoidal radio frequency transmission voltage with a constant amplitude.

The object is further satisfied by a method for detecting metallic targets, by a transmitter coil for generating a magnetic field, by a receiver coil which is influenced by the magnetic field, by an excitation device which excites the transmitter coil and by an evaluation device which evaluates the transmitter coil and/or the excitation device as well as the receiver coil, wherein the evaluation device generates an output signal which depends on a voltage ratio between a transmission voltage of the transmitter coil and/or of the excitation device and a reception voltage of the receiver coil, wherein the excitation device generates a sinusoidal radio frequency transmission voltage.

The object is further satisfied by a method for detecting metallic targets, by a transmitter coil for generating a magnetic field, by a receiver coil which is influenced by the magnetic field, by an excitation device which excites the transmitter coil and by an evaluation device which evaluates at least the receiver coil, wherein the evaluation device generates an output signal which depends on a reception voltage of the receiver coil, wherein the excitation device generates a sinusoidal radio frequency transmission voltage with a constant amplitude.

Especially wide distance measurements and high sensitivities are achieved on the basis of this design of the inductive proximity sensor in accordance with the invention, wherein the distance measurement is largely independent of the conductive target material and is thus largely material-independent. The ratio of the amplitude of the measured reception voltage to the amplitude of the transmission voltage or the measured reception voltage at a constant transmission voltage is a measure for the target distance. A continuous distance measurement, and not only the determination of a switching point, is possible by the voltage ratio formation or by the measurement of the reception voltage.

Since only a voltage ratio from reception voltage and transmission voltage is formed or since only the reception voltage is measured at a constant transmission voltage, the result is independent of a reference value such as with resistors or capacitors whose values can vary considerably due to aging or temperature influences.

Before looking at the operation of the inductive proximity sensor in accordance with the invention, its components should first be explained in more detail.

The inductive proximity sensor in accordance with the invention has a transmitter coil which is electrically connected to the excitation device and which is excited by it.

Within the framework of the invention, the excitation device can comprise one unit or also a plurality of components electrically connected to one another and spatially separate. The excitation device can additionally have a single voltage source for exciting the transmitter coil.

The transmitter coil is inductively coupled with the receiver coil. The time-variable magnetic fields which are generated by the excitation of the transmitter coil thereby induce a voltage in the receiver coil, the reception voltage.

Furthermore, in accordance with the invention, the evaluation device is provided which is electrically connected to the transmitter coil and/or to the excitation device, on the one hand, as well as to the receiver coil, on the other hand, and receives and evaluates a transmission voltage of the transmitter coil and/or of the excitation device as well as a reception voltage of the receiver coil such that a voltage ratio between the transmission voltage and the reception voltage is generated and evaluated. This signal evaluation then generates an output signal which is dependent on the voltage ratio and is thus dependent on a coupling and dependent on the distance of the target.

In the independent solution in which a constant transmitter voltage is used, the evaluation device is only connected to the receiver coil.

It has been recognized in accordance with the invention that a voltage ratio between the reception voltage induced in the receiver coil and the transmission voltage occurring in the excitation device and/or in the transmitter coil varies proportionally to the distance of a target when the transmission voltage is a radio frequency voltage. Such a voltage ratio can be detected by the evaluation device of the proximity sensors which thus delivers exact distance information. The same applies to the measured reception voltage with a constant transmission voltage.

It has been found in accordance with the invention that coupling factors between the transmitter coil and the metallic target of different materials approximate one another at radio frequencies. The measured voltage ratio then indicates a value which is proportional to the distance and which is almost independent of the metallic material of the target. Especially the difference between the ferromagnetic and non-ferromagnetic materials has no effect on the voltage ratio and thus no effect on the distance thereby determined.

The voltage ratio or the reception voltage can be evaluated digitally or by analog means. With an analog voltage ratio formation, the signal can subsequently be digitized for further evaluation.

The sinusoidal radio frequency transmission voltage advantageously has a frequency of 0.5 MHz to 5 MHz, in particular 1 MHz to 3 MHz. In the frequency range from 0.5 MHz to 5 MHz, the coupling factors between the transmitter coil and the metallic target of different materials approximate one another and simultaneously, in this frequency range, a maximum reception voltage variation is present which results in a maximum sensitivity. In the preferred range from 1 MHz to 3 MHz, the excitation device and the evaluation device have a particularly simple and inexpensive structure.

In a further development of the invention, the evaluation device is formed by an analog/digital converter, wherein the reception voltage is conducted to an analog/digital converter input and the transmission voltage is connected as a reference voltage to the analog/digital converter. The evaluation device is designed particularly simply by the use of an analog/digital converter since the transmission voltage is connected directly as a reference voltage to a reference voltage input of the analog/digital converter.

In accordance with a further embodiment, the evaluation device is formed by an analog/digital converter and by a division unit, wherein both the transmission voltage and the reception voltage can be digitized using the analog/digital converter and the division unit is provided for dividing the digital values of the transmission voltage and the reception voltage. Since the analog/digital converter digitizes the reception voltage and the transmission voltage after one another, that is alternately, only a single analog/digital converter is necessary. In this respect, conversion errors of the analog/digital converter have an equal effect on the digital values of the transmission voltage and of the reception voltage. The digital values of the transmission voltage or reception voltage are buffered in a memory so that both values are available for the division unit.

In accordance with a preferred embodiment, the evaluation device is alternatively formed by two analog/digital converters and one division unit, wherein the transmission voltage can be digitized by a first analog/digital converter, the reception voltage can be digitized by a second analog/digital converter and the division unit is provided for dividing the digital values of the first analog/digital converter and of the second analog/digital converter. The formation of the voltage ratio of transmission voltage and reception voltage is simple due to the digital division unit. The digital values are simple to process and the voltage ratio can advantageously be output as a digital value as an output signal. The digital values can, for example, be output by an interface such as an I/O link in which switching signals and messages can be output on a common line.

In a further development of the invention, the excitation device is formed by the transmission coil with a capacitor to make an LC oscillator which generates the transmission voltage. The transmission voltage can be generated in a very simple manner by the use of the LC oscillator as a transmitter oscillation circuit and simultaneously energy can be saved since a large part of the energy is stored in the transmitter oscillation circuit.

In a further development of the invention, a voltage regulator is present which regulates the transmission voltage to a constant value. The reception voltage is thereby only dependent on the coupling factors and on the inductances of the transmitter coil and of the receiver coil and is not influenced by any additional reference element.

In a further preferred embodiment, the evaluation unit is formed by a $\Sigma\Delta$ modulator. The reception voltage of the reception inductance is supplied to the input of the one $\Sigma\Delta$ modulator and is conducted from this through a filter, called a loop filter in the following, to an A/D converter at whose output a signal is applied which provides information on the distance of the target. A very sensitive evaluation and a high resolution of the reception voltage can be carried out by the use of a $\Sigma\Delta$ modulator. It is thus possible, for example, to detect and evaluate voltage changes in the range from 10-6 of the reception voltage. The high resolution is facilitated due to the noise shaping property of the $\Sigma\Delta$ modulator, by which interference influences (e.g. white noise) can be largely suppressed.

Figure 2:
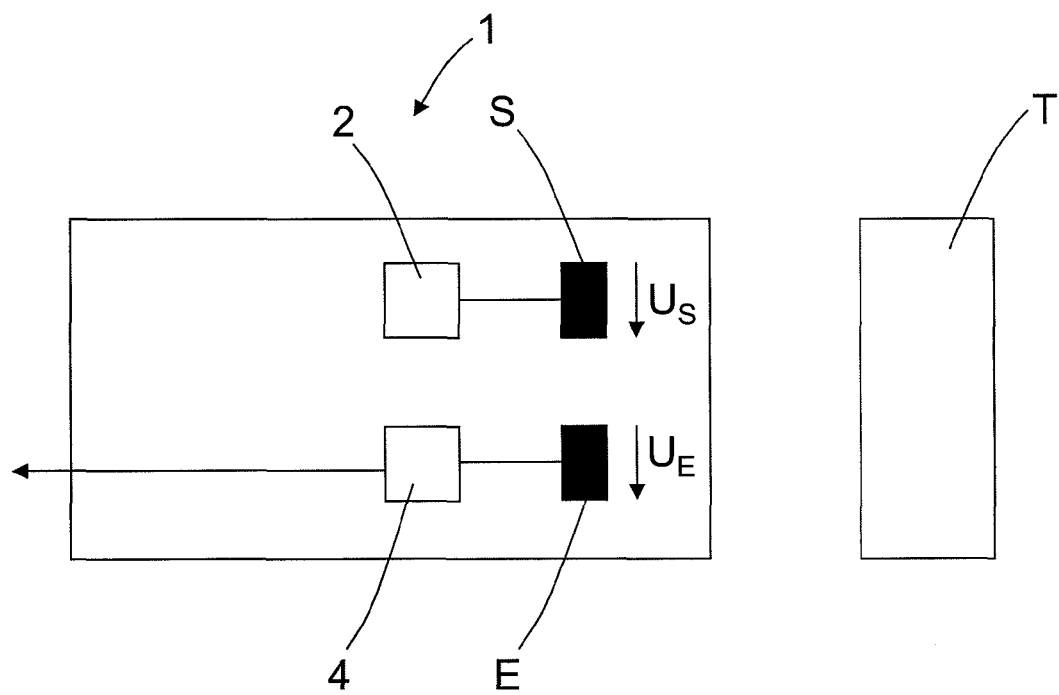
Figure 3:
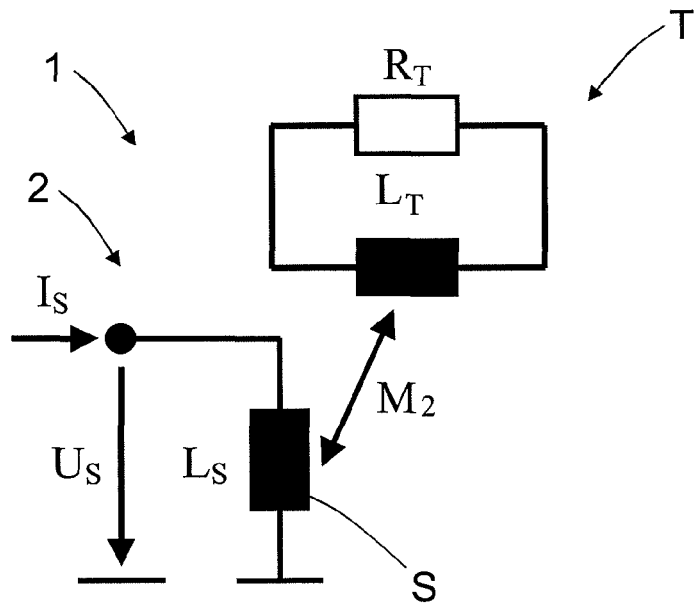
Figure 4:
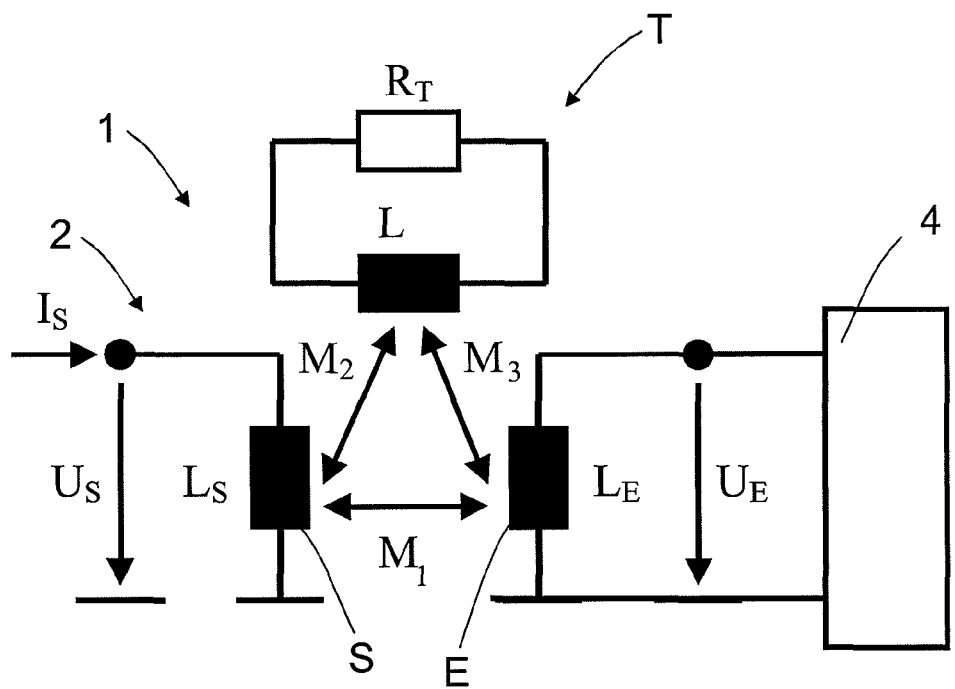
Figure 5:
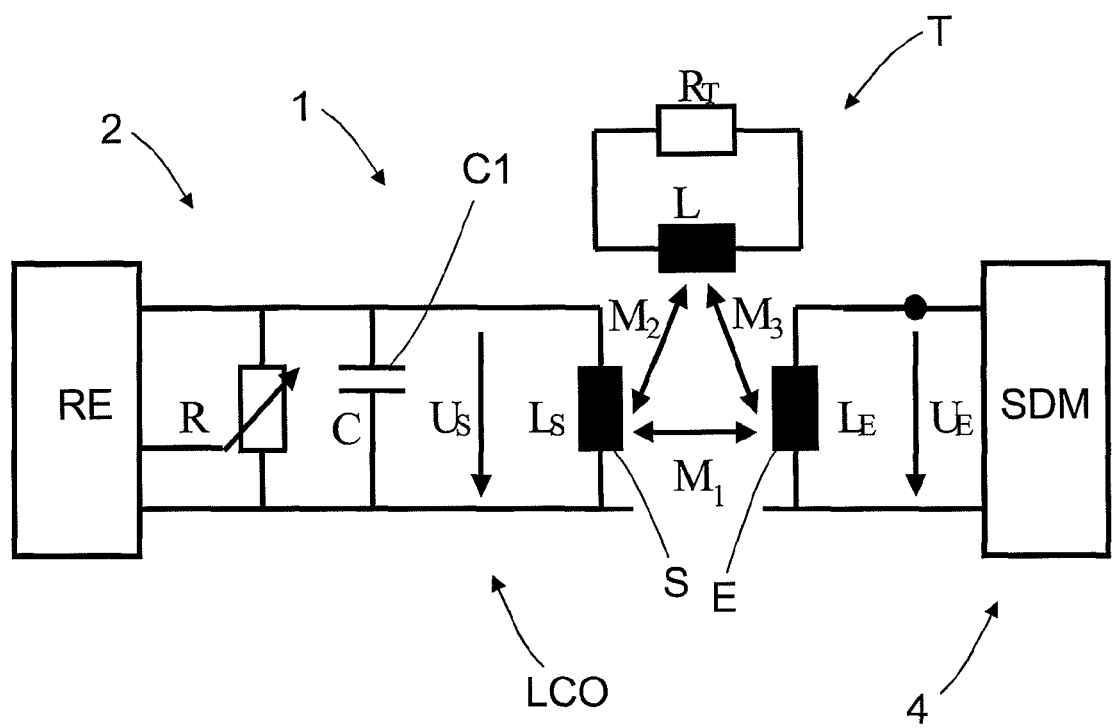

There are shown in the drawing:

FIG. 1 a first inductor sensor in accordance with the invention;

FIG. 2 a second inductor sensor in accordance with the invention;

FIG. 3 an equivalent circuit diagram of a transmitter coil and of a metallic target;

FIG. 4 an equivalent circuit diagram with a transmitter coil, a receiver coil and a metallic target; and FIG. 5 an equivalent circuit diagram in accordance with FIG. 2, with the transmitter coil being integrated in an LC oscillator.

In the following Figures, the same parts are marked by the same reference numerals.

FIG. 1 shows a first inductive proximity sensor 1 in accordance with the invention having a transmitter coil S, a receiver coil E, an excitation device 2 which is connected to the transmitter coil, and an evaluation device 4 which is connected to the transmitter coil S and/or to the excitation device 2 as well as to the receiver coil E. The evaluation device 4 is designed to generate an output signal which depends on a voltage ratio between a transmission voltage $U_S$ of the transmitter coil S and/or of the excitation device 2 and a reception voltage $U_E$ of the receiver coil E. The excitation device 2 is designed to generate a sinusoidal radio frequency transmission voltage $U_S$. The reception voltage $U_E$ is in this respect influenced by a metallic target T which should be detected by the inductive proximity sensor 1.

FIG. 1 shows a second inductive proximity sensor 1 in accordance with the invention having a transmitter coil S, a receiver coil E, an excitation device 2 which is connected to the transmitter coil, and an evaluation device 4 which is connected to the receiver coil E. The evaluation device 4 is designed to generate a output signal which is dependent on a reception voltage $U_E$ of the receiver coil E. The excitation device 2 is designed to generate a sinusoidal radio frequency constant transmission voltage $U_S$. As already explained with reference to FIG. 1, the reception voltage $U_E$ is influenced by a metallic target T which should be detected by the inductive proximity sensor 1.

The equivalent circuit diagram of a transmitter coil S and of a metallic target T of FIGS. 1 and 2 is shown in FIG. 3. The subsequent calculation shows, in accordance with the invention, how a material-independent distance signal is generated by the inductive proximity sensor with the aid of a radio frequency in the megahertz range (MHz) and with the aid of a material-independent coupling factor.

The equivalent circuit diagram in accordance with FIG. 3 is described by the following differential equation system, where $U_S$ is the transmission voltage, $L_S$ the inductance of the transmitter coil S, $M_2$ the counter-inductance, $L_T$ the inductance of the target T, $R_T$ the internal resistance of the target, $I_S$ the transmission current and $I_T$ the target current.

$$U_S = \frac{dI_S}{dt}L_S + \frac{dI_T}{dt}M_2$$

$$0 = I_T R_T + \frac{dI_T}{dt}L_T + \frac{dI_S}{dt}M_2$$

An equation in the frequency range with a coupling factor $K_2$ is obtained by transformation of the equation system from the time range into the frequency range by Laplace transformation and conversion of the equations according to $U_S/I_S$.

Investigations of the inventors have shown that the following correlation essential to the invention applies at high frequencies, namely that the coupling factors between the transmitter coil S and the metallic target T of different materials approximate one another at high frequencies in the radio frequency range, that is in the MHz range.

$$\omega^2 >> \left(\frac{R_T}{L_T}\right)^2$$

The impedance of the transmitter coil S can be greatly simplified under this condition.

$$\frac{U_S}{I_S} = K_2^2 L_S \frac{R_T}{L_T} + j\omega L_S(1 - K_2^2)$$

The result shows that the imaginary portion of the coil impedance is independent of the material parameter $R_T/L_T$ and is only dependent on the coupling factor $K_2$ which is almost independent of the target material used.

A first measuring process can be derived from this. The frequency of a harmonious LC oscillator which operates at a high frequency in the radio frequency range is a material-independent value for a target distance. This is documented by the following equation for the resonant frequency of an LC oscillator having a capacitor C1 with a capacity C:

$$f_R = \frac{1}{2\pi}\sqrt{\frac{1}{CL_S(1-K_2^2)}}$$

This method is still further improved as shown in the following. The properties of the capacitor C1 having the capacity C1, that is its exactness, aging and temperature drift, previously had a direct effect on the measured signal. A high-resolution frequency measurement furthermore requires a large measuring time, which restricts the signal bandwidth to be processed. For this reason, the absolute value of the impedance of the transmitter coil S is calculated in the next step, with the approximation of the coupling factors $K_2$ at high frequencies again results in a great simplification of the impedance of the transmitter coil S.

$$\left|\frac{U_S}{I_S}\right| = \omega L_S(1 - K_2^2)$$

The result shows that the absolute value of the impedance of the transmitter coil S in the radio frequency range is likewise almost independent of the target material.

Two improved measurement processes can be derived from this, as shown in FIG. 4. If the transmitter coil S is fed by a radio frequency sinusoidal current $I_S$ with a constant or target-independent amplitude, a material-independent measure for the target distance is obtained via the measurement of the reception voltage $U_E$. Conversely, on feeding of a sinusoidal radio frequency voltage $U_S$ with a constant or target-independent voltage amplitude, the same information is obtained by measurement of the current.

Both measuring processes are still further improved as shown in the following. The generation of a stable sinusoidal current $I_S$ requires an exact resistance whose properties, namely its exactness, aging and temperature drift, enter into the measured result. The same applies conversely on the voltage feed for the current measurement.

This problem can be solved with the aid of a receiver coil E in accordance with FIG. 4 which converts the current information back into a voltage signal again on feeding with a sinusoidal voltage $U_S$. The great advantage of this concept is that a material-independent measure for the target distance, which is independent of an accurate reference value such as the resistance value, voltage value or frequency value, is obtained by the measurement of the reception voltage $U_E$ and the forming of the ratio with the target-independent, constant or known transmission voltage $U_S$.

The equivalent circuit diagram of this embodiment is shown in FIG. 4. The following calculation shows the function of this embodiment.

The equivalent circuit diagram in accordance with FIG. 4 is described by the following differential equation system, where $U_S$ is the transmission voltage, $L_S$ the inductance of the transmitter coil S, $M_2$ the counter-inductance, $L_T$ the inductance of the target T, $R_T$ the internal resistance of the target, $I_S$ the transmission current and $I_T$ the target current, $U_E$ the reception voltage, $M_1$ a counter-inductance and $M_3$ a counter inductance.

$$U_S = \frac{dI_S}{dt}L_S + \frac{dI_T}{dt}M_2$$

$$0 = I_T R_T + \frac{dI_T}{dt}L_T + \frac{dI_S}{dt}M_2$$

$$U_E = \frac{dI_S}{dt}M_1 + \frac{dI_T}{dt}M_3$$

By transforming the equation system into the frequency range by Laplace transformation and conversion of the equations in accordance with $U_E/I_S$, amount formation and subsequent simplification, after which the coupling factors approximate one another at high frequencies, an equation $|U_E/U_S|$ is obtained, where $K_1$, $K_2$ and $K_3$ each represent a coupling factor.

$$\omega^2 \gg \left(\frac{R_T}{L_T}\right)^2$$

$$\left|\frac{U_E}{U_S}\right| = \sqrt{\frac{L_E}{L_S}} \frac{(K_1 - K_2 K_3)}{1 - K_2^2}$$

The result shows that with this embodiment, in which the transmitter coil S is fed with a radio frequency sinusoidal voltage $U_S$ which has a known or constant voltage amplitude, an output signal is obtained at the receiver coil E, which is picked up at high ohm, by ratio forming with the reception voltage $U_E$, said output signal representing a measure for the target distance independent of the target material. This signal is only still dependent on the coupling factors $K_1$, $K_2$ and $K_3$ and on the inductances $L_S$ and $L_E$ and is not additionally influenced by any additional reference element.

It is naturally also possible to feed the transmitter coil S at the transmitter side with a radio frequency sinusoidal current $I_S$. A reference resistance would, however, again be necessary for this purpose.

In the following, the feed of the transmitter coil S with a radio frequency sinusoidal transmission voltage $U_S$ whose amplitude is known or constant is further improved so that this sinusoidal transmitter voltage $U_S$ is relatively simple to implement and the energy consumption is additionally very small since the feed current is stored.

For a further improvement, the transmitter coil is integrated in an LC oscillator LCO in accordance with FIG. 5. A sinusoidal voltage $U_S$ is thereby generated and the energy fed in is stored in the resonant circuit in part.

A disadvantage of a resonant circuit which is fed with a constant current is that the voltage amplitude is mainly dependent on the real portion of the coil impedance. This means that the transmission amplitude is no longer independent of the target material.

The resonant circuit is furthermore improved in that a transmitter coil S is used in which the transmitter coil S is integrated in an LC oscillator LCO whose oscillation amplitude is regulated to a constant value using a regulator RE and, for example, a variable resistance R. The above-calculated formula thereby applies and a material-independent output signal for the target distance is again obtained by a high ohmic measurement of the voltage amplitude of the reception voltage $U_E$. The equivalent circuit diagram of this embodiment is shown in FIG. 5.

A further possibility is to measure both the voltage amplitude of the reception voltage $U_E$ and the voltage amplitude of the transmission voltage $U_S$ and to form the ratio of these two values. This can be done, for example, in that both values are digitized using a single analog/digital converter or separate analog/digital converters and are subsequently divided. A further possibility is to use the transmission voltage $U_S$ as a reference voltage at an ADC which digitizes the reception amplitude, which likewise corresponds to a division.

A further possibility is to use a sigma delta modulator (ΣΔ modulator) SDM as an evaluation device 2. The reception voltage $U_E$ of the reception inductance LE is supplied to the input of the ΣΔ modulator and is conducted from this through a filter, called a loop filter in the following, to an A/D converter at whose output a signal is applied which provides information on the distance of the target, which results in a suitable output signal. A high exactness becomes possibly by the noise formation, known per se, of the ΣΔ modulator SDM by which a quantification noise is shifted to higher frequencies, whereby the wanted signal, that is the reception voltage $U_E$, can be detected with a high signal-to-noise distance.

Reference Numerals
1 inductive proximity sensor
2 excitation device
4 evaluation device
$U_S$ transmission voltage
$U_E$ reception voltage
S transmitter coil
E receiver coil
C1 capacitor
$L_S$ inductance of the transmitter coil S
$L_E$ inductance of the receiver coil E
$L_T$ inductance of a target
T target
C electric capacity of a capacitor C1
$I_S$ transmission current
$I_T$ target current
$M_1$ counter inductance
$M_2$ counter inductance
$M_3$ counter inductance
$K_1$ coupling factor
$K_2$ coupling factor
$K_3$ coupling factor
$R_T$ internal resistance of a target
R variable electrical resistance
RE regulator
SDM Sigma Delta modulator (ΣΔ modulator)
LCO LC oscillator

The invention claimed is:

1. An inductive proximity sensor comprising a transmitter coil (S), a receiver coil (E),
an excitation device (2) which is connected to the transmitter coil (S), and an evaluation device (4) which is connected to the transmitter coil (S) and/or to the excitation device (2) as well as to the receiver coil (E),
wherein the evaluation device (4) is designed to generate an output signal which is dependent on a voltage ratio between a transmission voltage ($U_S$) of the transmitter coil (S) and of the excitation device (2) and a reception voltage ($U_E$) of the receiver coil (E), with the excitation device (2) being designed to generate a sinusoidal radio frequency transmission voltage ($U_S$),
wherein the sinusoidal radio frequency transmission voltage ($U_S$) has a frequency of 0.5 MHz to 5 MHz,
wherein the excitation device (2) forms an LC oscillator (LCO) which is designed to generate the transmission voltage ($U_S$) by the transmitter coil (S) with a capacitor (C), and
wherein a regulator (RE) is present which regulates the transmission voltage ($U_S$) to a constant value and the regulator (RE) is a voltage regulator.

2. An inductive proximity sensor in accordance with claim 1, wherein the evaluation device (4) is formed by an analog/digital converter, with the reception voltage ($U_E$) being conducted to the analog/digital converter input and the transmission voltage ($U_S$) being connected as a reference voltage to the analog/digital converter.

3. An inductive proximity sensor in accordance with claim 1, wherein the evaluation device (4) is formed by an analog/digital converter and by a division unit, with both the transmission voltage ($U_S$) and the reception voltage being able to be digitized by the analog/digital converter and with the division unit being provided for dividing the digital values of the transmission voltage ($U_S$) and of the reception voltage ($U_E$) or with the evaluation device (4) being formed by two analog/digital converters and one division unit, with the transmission voltage ($U_S$) being able to be digitized by a first analog/digital converter, with the reception voltage ($U_E$) being able to be digitized by a second analog/digital converter and with the division unit being provided for dividing the digital values of the first analog/digital converter and of the second analog/digital converter.

4. An inductive proximity sensor in accordance with claim 1, wherein the evaluation unit is formed by a $\Sigma\Delta$ modulator (SDM).

5. An inductive proximity sensor comprising a transmitter coil (S), a receiver coil (E),
   an excitation device (2) which is connected to the transmitter coil (S) and to an evaluation device (4) which is at least connected to the receiver coil (E),
   wherein the evaluation device (4) is designed to generate an output signal which is dependent on a reception voltage ($U_E$) of the receiver coil (E), with the excitation device (2) being designed to generate a sinusoidal radio frequency transmitter voltage ($U_S$) with a constant amplitude,
   wherein the sinusoidal radio frequency transmission voltage ($U_S$) has a frequency of 0.5 MHz to 5 MHz,
   wherein the excitation device (2) forms an LC oscillator (LCO) which is designed to generate the transmission voltage ($U_S$) by the transmitter coil (S) with a capacitor (C), and
   wherein a regulator (RE) is present which regulates the transmission voltage ($U_S$) to a constant value and the regulator (RE) is a voltage regulator.

6. An inductive proximity sensor in accordance with claim 5, wherein the evaluation device (4) is formed by an analog/digital converter, with the reception voltage ($U_E$) being conducted to the analog/digital converter input and the transmission voltage ($U_S$) being connected as a reference voltage to the analog/digital converter.

7. An inductive proximity sensor in accordance with claim 5, wherein the evaluation device (4) is formed by an analog/digital converter and by a division unit, with both the transmission voltage ($U_S$) and the reception voltage being able to be digitized by the analog/digital converter and with the division unit being provided for dividing the digital values of the transmission voltage ($U_S$) and of the reception voltage ($U_E$) or with the evaluation device (4) being formed by two analog/digital converters and one division unit, with the transmission voltage ($U_S$) being able to be digitized by a first analog/digital converter, with the reception voltage ($U_E$) being able to be digitized by a second analog/digital converter and with the division unit being provided for dividing the digital values of the first analog/digital converter and of the second analog/digital converter.

8. An inductive proximity sensor in accordance with claim 5, wherein the evaluation unit is formed by a $\Sigma\Delta$ modulator (SDM).

9. A method of detecting metallic targets comprising a transmitter coil (S) for generating a magnetic field, a reception coil (E), which is influenced by the magnetic field,
   an excitation device (2) which excites the transmitter coil (S), and an evaluation device (4) which evaluates the transmitter coil (S) and/or the excitation device (2) as well as the receiver coil (E), wherein the evaluation device (4) generates an output signal which is dependent on a voltage ratio between a transmission voltage ($U_S$) of the transmitter coil (S) and of the excitation device (2) and of a reception voltage ($U_E$) of the receiver coil (E), with the excitation device (2) generating a sinusoidal radio frequency transmission voltage ($U_S$),
   wherein the sinusoidal radio frequency transmission voltage ($U_S$) has a frequency of 0.5 MHz to 5 MHz,
   wherein the excitation device (2) generates the transmission voltage ($U_S$) by oscillation, and
   wherein the transmission voltage ($U_S$) is regulated to a constant value.

10. A method of detecting metallic targets in accordance with claim 9, wherein the evaluation device (4) carries out an analog/digital conversion, with the reception voltage ($U_E$) serving as an input value and the transmission voltage ($U_S$) serving as a reference value for the analog/digital conversion.

11. A method of detecting metallic targets in accordance with claim 9, wherein the evaluation device (4) carries out an analog/digital conversion and a division, with the transmission voltage ($U_S$) and the reception voltage being digitized in a respective time-separate analog/digital conversion, and with the digital values of the transmission voltage ($U_S$) and of the reception voltage ($U_E$) being divided or with the evaluation device (4) carrying out two analog/digital conversions in parallel and subsequently carrying out a division, with the transmission voltage ($U_S$) being digitized in a first analog/digital conversion, with the reception voltage ($U_E$) being digitized in a second analog/digital conversion, and the digital values of the transmission voltage ($U_S$) and of the reception voltage ($U_E$) being divided.

12. A method of detecting metallic targets comprising a transmitter coil (S) for generating a magnetic field, a reception coil (E), which is influenced by the magnetic field,
   an excitation device (2) which excites the transmitter coil (S), and an evaluation device (4) which at least evaluates the receiver coil (E,)
   wherein the evaluation device (4) generates an output signal which is dependent on a reception voltage ($U_E$) of the receiver coil (E), with the excitation device (2) generating a sinusoidal radio frequency constant transmission voltage ($U_S$) with a constant amplitude,
   wherein the sinusoidal radio frequency transmission voltage ($U_S$) has a frequency of 0.5 MHz to 5 MHz,
   wherein the excitation device (2) generates the transmission voltage ($U_S$) by oscillation, and
   wherein the transmission voltage ($U_S$) is regulated to a constant value.

13. A method of detecting metallic targets in accordance with claim 12, wherein the evaluation device (4) carries out an analog/digital conversion, with the reception voltage ($U_E$) serving as an input value and the transmission voltage ($U_S$) serving as a reference value for the analog/digital conversion.

14. A method of detecting metallic targets in accordance with claim 12, wherein the evaluation device (4) carries out an analog/digital conversion and a division, with the transmission voltage ($U_S$S) and the reception voltage being digitized in a respective time-separate analog/digital conversion, and with the digital values of the transmission voltage ($U_S$) and of the reception voltage ($U_E$) being divided or with the evaluation device (4) carrying out two analog/digital conversions in parallel and subsequently carrying out a division, with the transmission voltage ($U_S$) being digitized in a first analog/digital conversion, with the reception voltage ($U_E$) being digitized in a second analog/digital conversion, and the digital values of the transmission voltage ($U_S$) and of the reception voltage ($U_E$) being divided.

* * * * *